United States Patent [19]

Boucheron

[11] Patent Number: 5,581,130
[45] Date of Patent: Dec. 3, 1996

[54] CIRCUIT BOARD FOR THE CONTROL AND/OR POWER SUPPLY OF ELECTRICAL FUNCTION DEVICES OF A VEHICLE

[75] Inventor: Jean-Louis Boucheron, Savigny-le-Temple, France

[73] Assignee: Valoe Electronique, Voisins-le-Bretonneux, France

[21] Appl. No.: 50,880

[22] Filed: Apr. 21, 1993

[30] Foreign Application Priority Data

Apr. 22, 1992 [FR] France .................................. 92 04919

[51] Int. Cl.⁶ ...................................................... H05K 1/14
[52] U.S. Cl. ...................... 307/10.1; 361/684; 361/736; 361/752; 439/76.2; 439/655; 439/696
[58] Field of Search ...................................... 307/10.1, 9.1; 361/684, 709, 736, 752, 796; 439/65, 76.2, 655, 695; 123/41.23, 480

[56] References Cited

U.S. PATENT DOCUMENTS

| 4,218,724 | 8/1980 | Kaufman | 361/395 |
| 4,557,225 | 12/1985 | Sagues et al. | 361/684 |
| 5,040,097 | 8/1991 | Stribel | 361/395 |
| 5,053,634 | 10/1991 | Kakinuma | 307/9.1 |

FOREIGN PATENT DOCUMENTS

| 0181534 | 5/1986 | European Pat. Off. | H05K 7/02 |
| 0259897 | 3/1988 | European Pat. Off. | H01R 9/09 |

*Primary Examiner*—William M. Shoop, Jr.
*Assistant Examiner*—Peter Ganjoo
*Attorney, Agent, or Firm*—Morgan & Finnegan, LLP

[57] ABSTRACT

Electrical devices in a vehicle are controlled and supplied with power through a system which includes a circuit board. The circuit board has removable modules which are mounted on a flat base or support, and which are connected at least electrically by coupling means in such a way that the power supply system for the electrical devices of the vehicle is modular, without being linked to any particular type or model of vehicle.

8 Claims, 5 Drawing Sheets

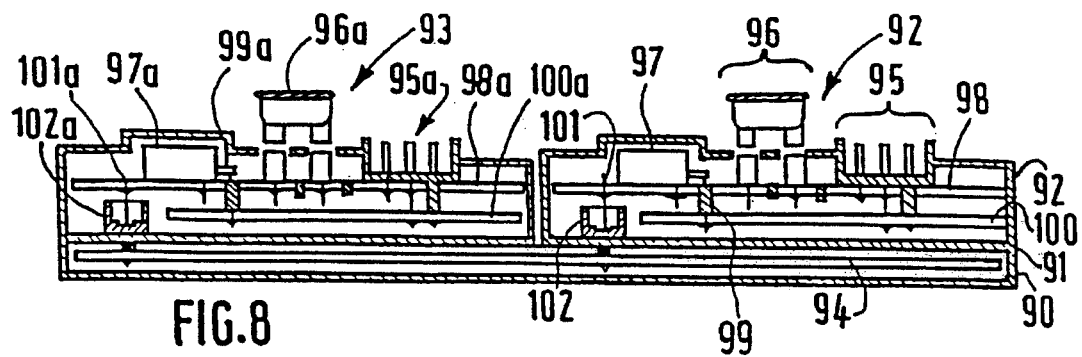
FIG.8
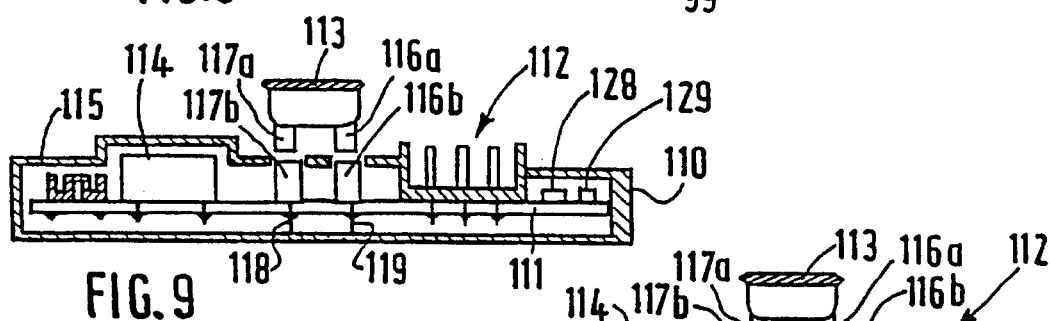
FIG.9
FIG.10
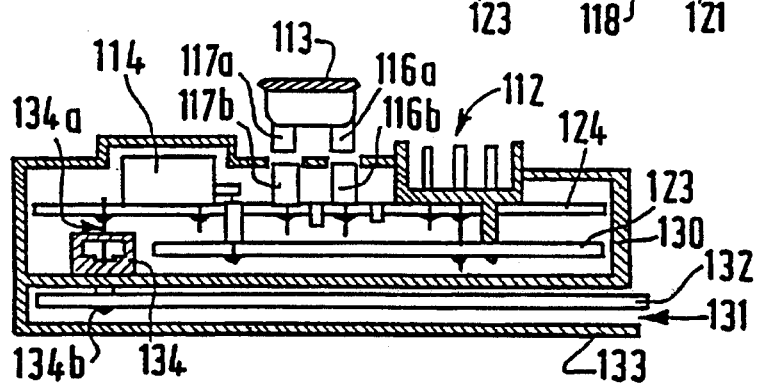
FIG.11
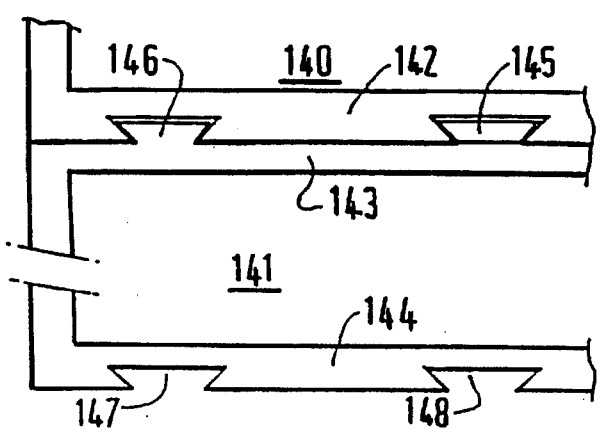
FIG.12

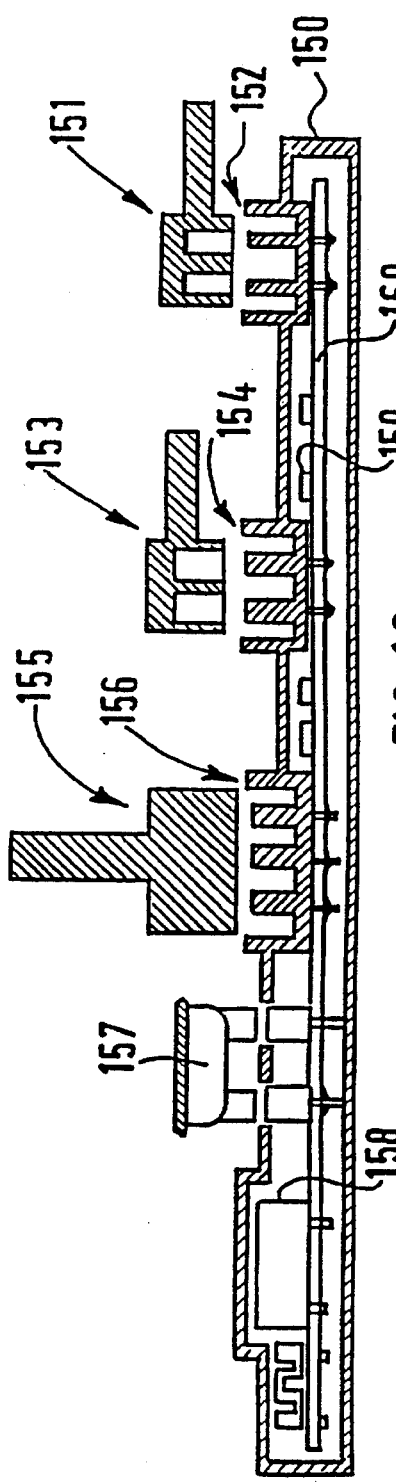
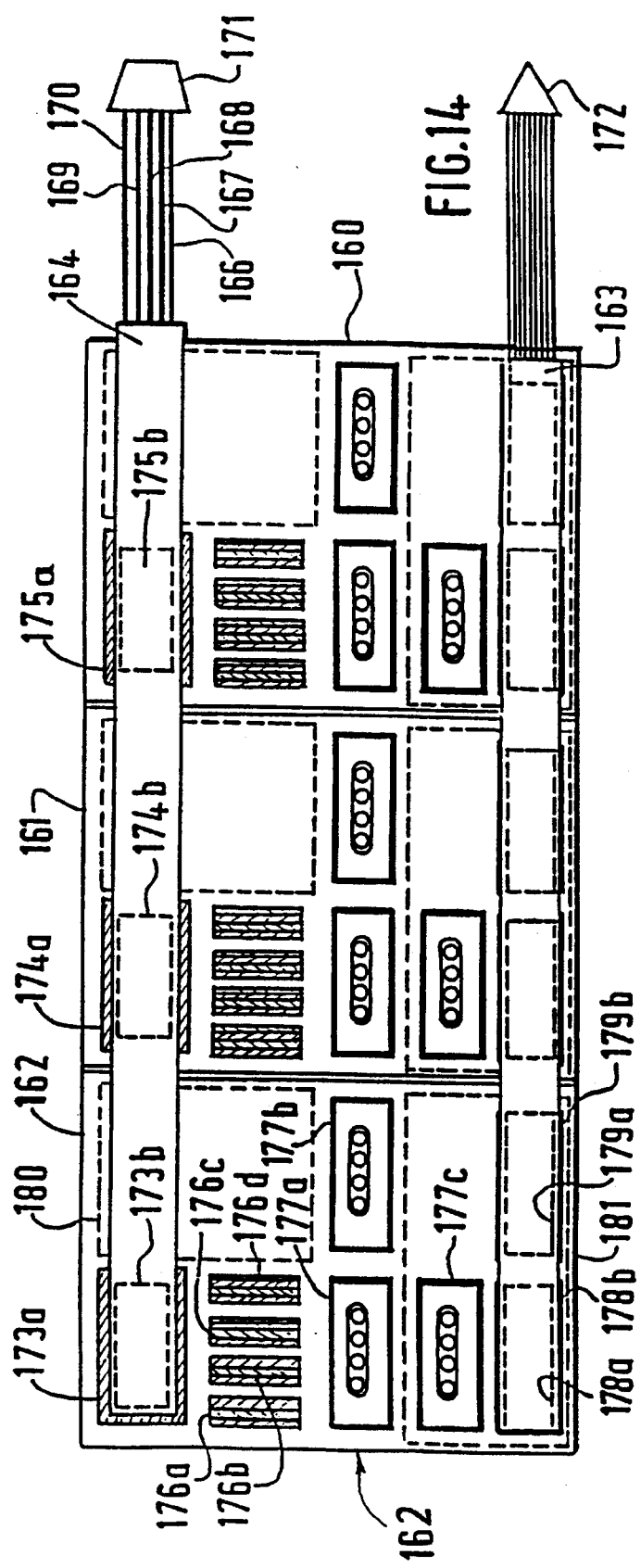

CIRCUIT BOARD FOR THE CONTROL AND/OR POWER SUPPLY OF ELECTRICAL FUNCTION DEVICES OF A VEHICLE

FIELD OF THE INVENTION

The present invention relates to a circuit board for the control and/or power supply of electrical function devices of a vehicle. The expression "function device" is to be understood to mean any electrical device that may be found in a vehicle, such as lights, indicators, windshield wipers, radio, window heaters, heating systems, and so on.

More particularly, the invention is directed to the realisation of the concept whereby certain functions are regrouped together, in such a way that protective devices (such as fuses), electrical connections, and electrical distribution means, are integrated together so that they constitute a cabin computer in modular form.

The circuit board of the invention is connected between a source of electrical energy and a source of control signals, on the one hand, and the function devices themselves on the other hand.

BACKGROUND OF THE INVENTION

In the prior art, it has already been proposed to provide systems in which the electrical energy coming from a supply source is distributed towards the electrical loads as a function of commands given, typically by the driver of the vehicle. However, these prior art arrangements have a certain number of drawbacks which the present invention proposes to overcome.

In the prior art arrangements for power supply in vehicles, the number of power supply and control wires is high, and this imposes a considerable penalty, in terms of both the overall cost of the electrical parts of the vehicle and to the technical complexity of the power supply system.

In addition, the prior art arrangements require to be perfectly matched with the various electrical function devices in the particular vehicle in which they are installed. For this reason, in the prior art, power supply arrangements are in general designed specifically for only one type of vehicle. In particular it is often necessary to redesign a large part of the electrical supply system, even when, in a vehicle of one given type or model, equipment options are only slightly different from the arrangements provided in the basic model.

Furthermore, the prior art vehicle electric supply arrangements usually include, starting from a circuit board, a certain number of plug-in components, and require a large number of connections for distribution in the system. This proliferation of connections is a major cause of the high cost of the system, and in addition it leads to a reduction in its reliability.

In the specification of European published patent application EP 0 181 534A, a system has been described which includes a central electrical unit for the centralised connection of electrical components such as cable harnesses, plug-in connectors, fuses and interruptors, these latter being typically in the form of relays, which are connected together through appropriate connecting layers. However, distribution of the power supply, or interconnection between specific modules linked to a circuit board, is not made possible by such an arrangement.

DISCUSSION OF THE INVENTION

An object of the present invention is to provide a remedy for the above mentioned drawbacks.

According to the invention, a circuit board for the control and/or power supply of electrical function devices of a vehicle, the circuit board being connected between at least one source of electrical power and a source of control signals on the one hand, and the said electrical function devices on the other hand, and comprising a support inside which there is disposed at least one layer of connecting means which will be referred to herein as a connecting (or connection) layer, with, disposed on at least one said layer, an electronic part which integrates together a plurality of associated protective devices, with power and logic control circuits for the said function devices, in such a way as to constitute a vehicle cabin computer, the circuit board being adapted to carry at least one plug-in module on a face of the said support, the said electronic part containing an electrical means associated with the control and/or power supply for at least one electrical function device of a given vehicle, is characterised in that it further includes a means for distribution of the electrical power supply and/or for interconnection between two plug-in modules.

Further features and advantages of the present invention will appear more clearly on a reading of the detailed description which follows, and in which, with reference to the accompanying drawings, a number of preferred embodiments of the present invention are described by way of example only, and compared with prior art arrangements.

BRIEF DESCRIPTION OF THE DRAWINGS

FIG. 8 is another simplified cross sectional view, showing a further form of circuit board in accordance with the present invention and having at least two separate modules.

FIG. 9 shows a further embodiment of a circuit board according to the present invention, in simplified form and in cross section, this circuit board having a single connection layer without any external connections.

FIG. 10 is a similar view of yet another circuit board in accordance with the invention, this time having two connection layers without any external connections.

FIG. 11 is a similar view showing part of a circuit board in a further form in accordance with the invention, this board having two interconnecting layers, together with external connections.

FIG. 12 is a scrap view showing a detail of a removable module in one form in accordance with the invention.

FIG. 13 is a simplified cross sectional view showing a circuit board according to the invention which includes connecting means in a modified form.

FIG. 14 is a plan view showing a circuit board according to the invention having a modified form of connecting means.

DESCRIPTION OF SOME PRIOR ART ARRANGEMENTS

Figure 1:
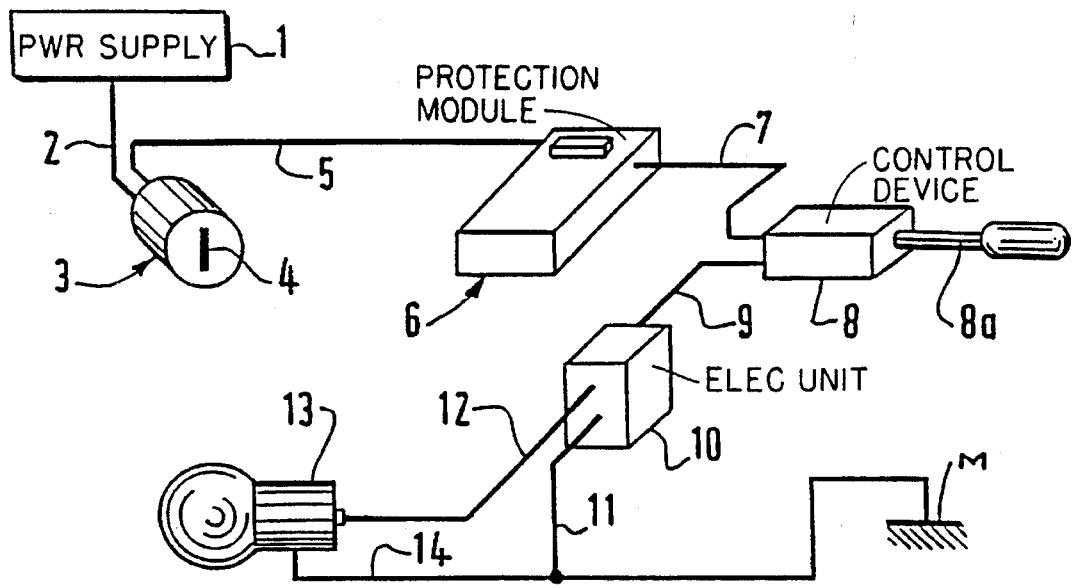
FIG. 1 is a diagram illustrating a very basic arrangement in accordance with the prior art, of a power supply system for an electrical function device on board a vehicle.

Reference is first made to FIG. 1, which shows a first embodiment of a power supply system for fitting on a vehicle in accordance with known principles. This system comprises a power supply unit 1 consisting of a battery and an alternator which is connected to the battery, these being carried on the vehicle. The output of the power supply unit 1 is transmitted to a selection module 3, on which certain means 4 are disposed. The means 4 may for example consist of an anti-theft device, or a key-operated ignition switch, or both.

A power supply function selection line 5 leads from the output of the selection module 3. This line 5 is connected to a protection module 6 which includes, mainly, a plurality of fuses or similar protective devices to provide protection against over-voltages and/or excessive currents. The output of the module 6 is taken through a line 7 to a control device 8, typically a manually-operated switch. This has a command device 8a such as an actuating lever for operating the switch 8, operated by the driver of the vehicle from the fascia of the latter, thereby imposing a command on the system.

The control device 8 has an output line 9 connected to an electronic unit 10 for electrical energy generation. This in turn is connected through a line 11 to the vehicle ground or earth M. The unit 10 is also connected, through an output line 12, to a load 13 in the form of a function device (as defined above) of the vehicle. As shown in FIG. 1, this function device is a lamp of one of the vehicle lights. The load 13 is also connected to ground M through a line 14.

In an arrangement such as that shown in FIG. 1, the number of function devices which are connected through electrical conductive lines or wires, or other energy carrying paths, is considerable. For this reason the manufacturing cost is high while the reliability of the system is low.

Figure 2:
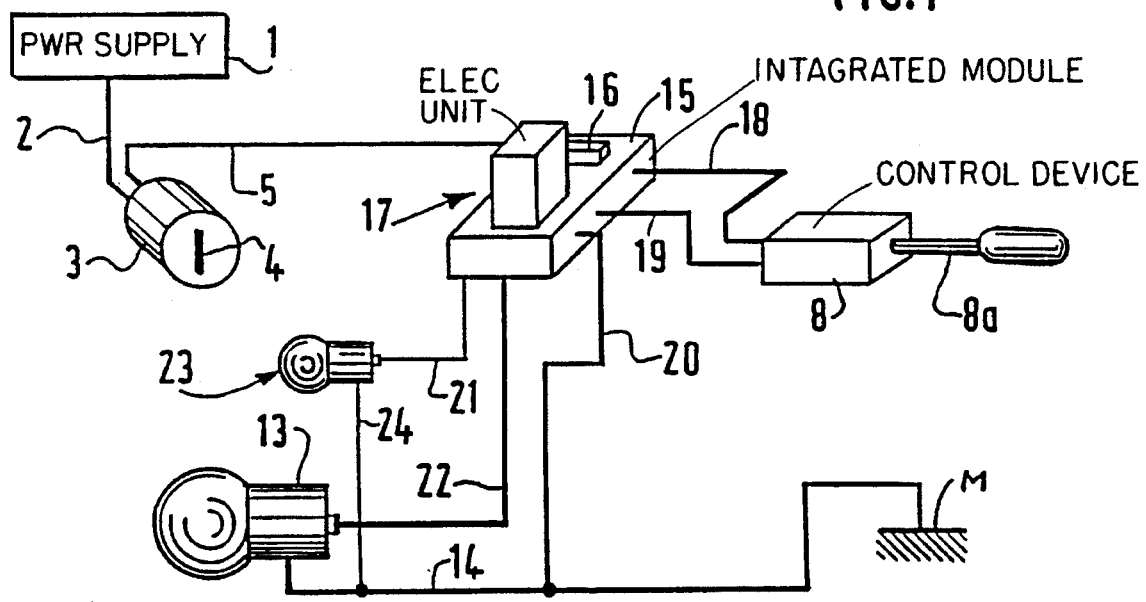
FIG. 2 is a similar diagram illustrating a modified version of the same, again in the prior art.

In order to remedy these drawbacks to some extent, it has also been proposed in the past to group the electronic unit 10 and the protective module 6 together in a single unit. Such an arrangement is shown in FIG. 2, in which the same elements as are represented in FIG. 1 carry the same reference numerals and need not be described here in any greater detail. The integrated module is indicated at 15 in FIG. 2, and includes the protective devices 16 such as fuses, together with an electronic unit 17 similar to the unit 10 in FIG. 1. The control device 8, with its manual switch lever or similar command device 8a, is connected to the integrated module 15 through two input lines 18 and 19. The module 15 is also connected through a line 20 to ground M, and through an output line 22 to the load 13, whereby power is distributed to the latter from the integrated module 15. The latter is also connected through a line 21 to an indicating device 23 such as a warning lamp, which in turn is connected to ground through another line 24. The grouping together of the electronic distribution unit and the protective devices eliminates some connections, such as the line 9 in FIG. 1, between the electronic unit and the control means for the system, which were present in the arrangement shown in FIG. 1.

Figure 3:
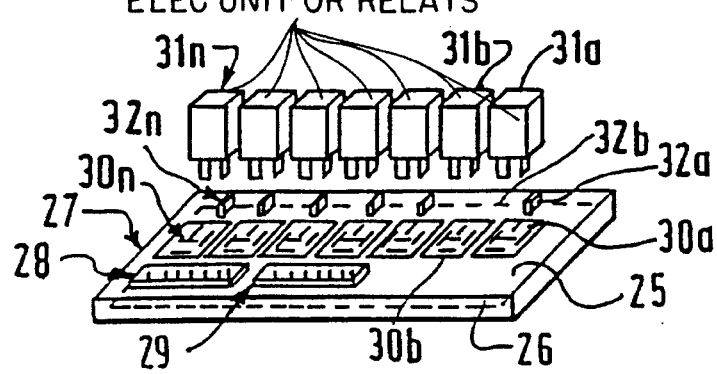
FIG. 3 is a diagrammatic perspective view showing a circuit board in one form known from the prior art.

Referring now to FIG. 3, this shows a prior art arrangement in which the various components are physically grouped together on a circuit board, as can for example be done with the integrated module 15 of FIG. 2. The circuit board comprises a housing 25 made of a suitable plastics material, for example in two halves, namely an upper half and a lower half, with at least one electrical connecting layer 26 arranged between the two halves. In FIG. 3 this connection layer is indicated in broken lines. On the upper surface 27 of the circuit board 25 there are connection zones 28 and 29, for connection to the electrical supply source and to the function devices, respectively.

In addition, the upper surface 27 of the circuit board 25 has a plurality of connectors 30a, 30b, . . . 30n, into which electronic units or relays 31a, 31b, . . . 31n can be plugged. Similarly, a plurality of fuses are arranged on the connectors 30a to 30n, these being indicated at 32a, 32b, . . . 32n.

This compact arrangement has the advantage that all of the protective devices and electronic modules are assembled together on a single circuit and in one place, so that a single accessible location can be provided for mounting the circuit board. Maintenance can then easily be carried out, such as the changing of a blown fuse or replacement of a plug-in relay or plug-in electronic device. However, the plug-in units 31a to 31n typically contain a number of electronic components, such as capacitors, transistors, resistors and so on. Each of these is intended to perform a simple electrical function, which is carried out according to predetermined electronic circuit diagrams, which are completed in the usual way by the conductive paths of the circuits of which these various components form part. These electrical paths are defined on the connection layer 26. There will be one electronic circuit corresponding to each of the loads or function devices of the vehicle that are connected through the connector 29. However, the internal connecting layer 26 has only one electrical layout, specifically designed so that it is adapted to provide distribution networks which include the protective devices and their required interconnections for application to a particular type or model of vehicle. With this concept, it is necessary to modify, in particular, the connecting layer 26 every time any modification has to be made to the electrical system of the vehicle.

In addition, a large number of connections are still required for connecting the function devices of the vehicle to the circuit board.

DESCRIPTION OF PREFERRED EMBODIMENTS OF THE INVENTION

Figure 4:
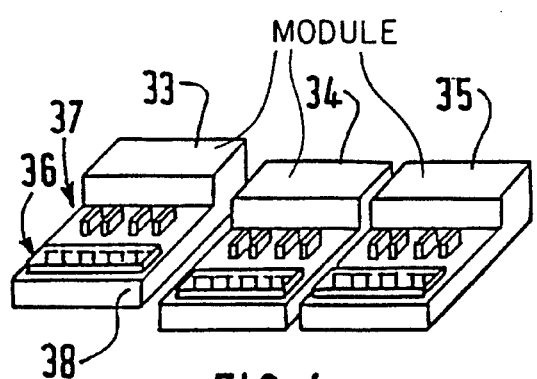
FIG. 4 shows a circuit board in a first embodiment of the present invention.

Reference is accordingly now made to FIG. 4, which shows a first means in accordance with the present invention for providing a remedy to this drawback of the prior art. FIG. 4 shows modules 33, 34 and 35, but there may be any required number of these modules.

A certain number of electrical and electronic supply and/or control functions are grouped in these various modules, either as a function of electrical or electronic requirements linked to the way in which the electrical circuits operate, or as a function of electrical function devices or groups of electrical function devices forming part of a vehicle.

As a general rule, the "architectural" design of the invention tends to optimise a group of functions with a view to minimising the external interconnections. In particular, the modules 33 to 35 are adapted to be plugged in to connectors similar to the connectors 30a to 30n in FIG. 3, but with each one including all of the electronic, electrical and protective functions which are provided for the purpose of providing connection to a group of electrical function devices, or at least one electrical function device, of a given vehicle.

When, in any given vehicle, some change is to be made in the electrical function device or devices, it is merely necessary to change the appropriate module 33, 34 or 35. Similarly, in the event of a fault, this can simply be rectified by removing and replacing the faulty module.

Finally, whereas in the prior art a module was associated with one specific type, or even one specific model, of vehicle, the invention makes it possible, instead, to associate a module with the type of function device itself, since this latter is generally suitable for use in various types, makes and models of vehicles.

Each module, for example the module 33, has a connector 36 through which it can be connected, firstly to the electrical load and secondly to the electrical supply source. It also includes a plurality of fuses 37 which are plugged in to an upper surface 38 of the module. And, as will be shown in greater detail later on in this description, the electronic means necessary for carrying out the control and/or power supply functions mentioned above are all arranged within the module 33.

Figure 5:
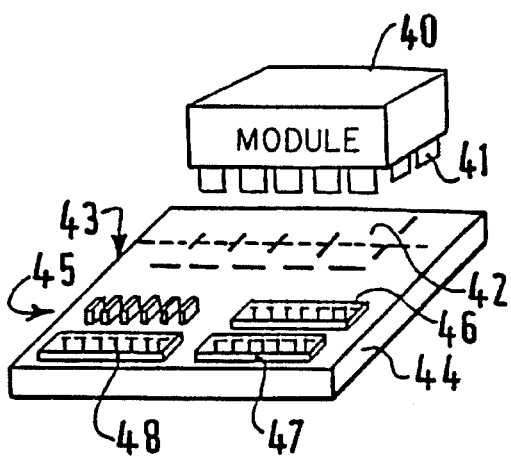
FIG. 5 shows a circuit board in a second embodiment of the present invention.

Referring now to FIG. 5, this shows another embodiment of the invention. In this arrangement, all of the electronic functions are grouped in a single plug-in module 40 having connecting fingers, such as the finger 41, which plug in to a connecting zone 42 on the upper surface 43 of a circuit board 44. The circuit board 44 comprises a body or support, within which a number of electrical connecting layers (not shown) are disposed. These connecting layers receive the connecting fingers such as the fingers 41 of the electronic module 40, the connecting fingers of a set of fuses 45, and the terminals of the electronic or electrical connections for connection, firstly to the power supply source through connector 46, and secondly to the loads through connectors 47 and 48.

In the modular design of FIG. 4, each module can be optimised as a function of:

requirements expressed in terms of the levels of equipment required for each vehicle or each type of vehicle; and cost and reliability criteria compatible with the operating requirements and acceptable manufacturing cost.

Figure 6:
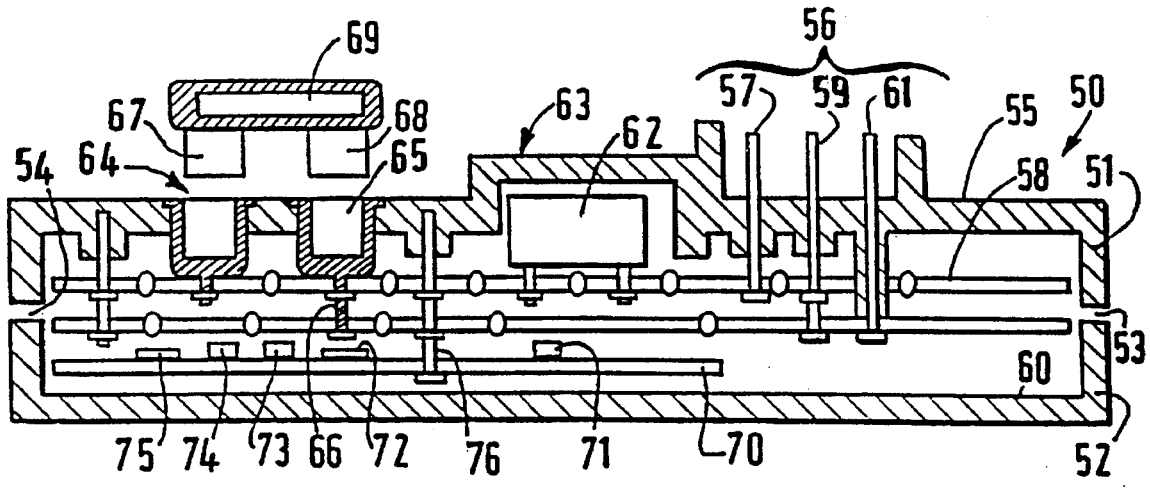
FIG. 6 is a simplified cross sectional view of a circuit board in another embodiment of the present invention.

Reference is now made to FIG. 6, which shows a first form of a circuit board into which the electronic module has been integrated in a non-removable way. This circuit board, indicated at 50, comprises a support which is in two halves, namely an upper half 51 and a lower half 52, which are connected together by means of a suitable fastening device (not shown). This may for example be a screw and gasket system between the opposed terminal edges 53 and 54 of the two halves 51 and 52. The upper surface 55 of the support 51, 52 includes at least one connector, such as the connector 56 which comprises a set of contact pins 57, 58, 61. These pins are part of respective cross-connecting elements, i.e. electrically conductive elements disposed transversely to the connecting layer or layers contained within the support or base of the circuit board. In the rest of this description, any cross-connecting element, as thus defined, will for brevity be referred to as a "pin", whether or not it includes a contact pin of a plug-in connector.

The pins 57 are connected to a first connection layer 58; the pins 61 are connected to both the first connection layer 58 and a second connection layer 60; and the pins 61 are connected only to the second connection layer 60. The pins 61 are insulated from the first connection layer 58, so as to constitute, for example, an electrical ground or earth.

A module 62 is disposed on the first connection layer 58. All of the power circuits for management of the power supply of the circuit board, or which (for example in the form of shunts) provide control for the current consumed, are integrated into the module 62. This integrated module may be provided with means for removing heat, such as a radiating means (not shown), which may for example project above the upper surface 55 of the support in the raised zone indicated at 63.

The upper surface 55 of the support also includes two female clip-type connectors 64 and 65. The connector 64 includes a base pin connected directly to the power connection layer 58, while the connector 65 has a base pin 66 which is connected to the ground connection layer 60. A fuse 69 has plug-in fingers 67 and 68 which are plugged into the connectors 64 and 65 respectively. It will be understood that the circuit board of FIG. 6 has a number of these fuses 69 with their associated clip-type connectors 64 and 65.

Inside the support 51, 52 there is also a third connecting layer 70. This carries, in the conventional way already known from the prior art, a number of electronic components such as the components 71, 72, 73, 74 and 75, thus grouping together the electronic functions performed by the resulting module incorporated on the circuit board. A conductive pin 76 connects the three layers 70, 60 and 58 electrically together, while other connections are also provided, such as to enable only a limited number of layers to be connected together depending on the requirements of the particular application.

The power supply module 62 has to have regard to the various levels of power supply available in the vehicle. In addition, the protective devices, such as the fuse 69, may be integrated within the interior of the circuit board, while remaining accessible for replacement purposes. It can be seen that the electronic functions are grouped and integrated on at least one internal connecting layer of the circuit board. The control signals can have only a low interrupting power, since the power control signal is relayed. The control signals are therefore transmitted at low current on the connector 56.

Finally, the arrangement of FIG. 6 may include diagnostic means for taking into account the identification of the functions being controlled, and this can be made comprehensive.

Figure 7:
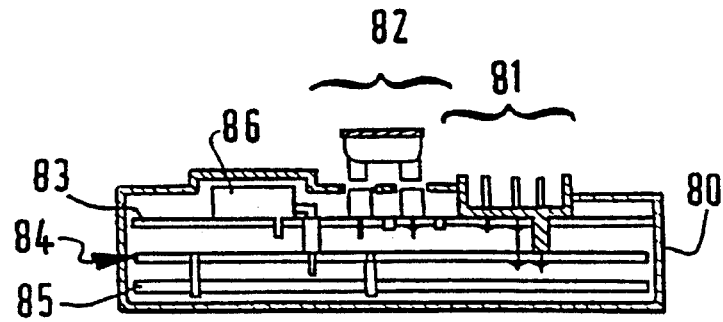
FIG. 7 is a simplified cross sectional view of a circuit board in a further embodiment of the present invention.

Reference will now be made to FIG. 7, which shows a second form of circuit board according to the invention. FIG. 7 shows a module which is adapted to be placed on a support or base plate, the function of which is, in general, purely mechanical with respect to the plug-in modules, but which may also have a thermal function. This module comprises a housing 80, having a connector 81 similar to the connector 56 described above with reference to FIG. 6, together with a series of protective elements 82 similar to the fuse 69 in FIG. 6, and three internal connection layers 83, 84 and 85. The purpose of the connection layer 83 is power management, while that of the layer 84 is power distribution. The layer 84 defines a connecting plane. The electronic module is integrated on to the layer 85. An integrated power generating module 86, connected on to the connection layer 83, is also shown. The component 86 is a transistor or an intelligent power component, which makes use of part of the first layer to make the power connections and to serve as a cooler, together with part of the second layer to carry the control signals. This modular design enables the electronic circuits, which are separate from each other in conventional arrangements, to be integrated with each other. In addition it enables a common electronic "heart" to be used. The modular design of this arrangement also enables each sub-assembly to be designed in the form of a station which is compatible with multiplexing.

The power module 86 is also connected to conventional protective fuses 82, and/or to other suitable devices giving protection against over-voltages.

The power distribution layer 84 enables the need for power connections to be reconciled with the need for low power level connections for control purposes. The power connections are made firstly at the input, to power supply sources such as the battery, and also at the output to the loads, which consist of the various electrical function devices of the vehicle. The low power level connections are made firstly at the control signal inputs, for the signals coming from the control devices such as those on the fascia, and secondly at the control signal outputs leading to the electrical loads. The electronic layer, such as the layer 85, which carries the electronic heart of the module, provides the power control signals, and thus provides the control and detection functions in the circuit board itself. It also provides the function of communication between the circuit board and the various function devices of the vehicle. It performs a number of integrated functions, such as generation of time delays. Finally, it carries out all the control logic functions from which logic states can be computed.

The supply connector, such as the connector 81 in FIG. 7 or 56 in FIG. 6, carries the polarities of the positive terminals of the battery, the "+ACC" terminal of an anti-theft device, the starter, headlamps, and so on.

In the power portion of the module, measurement of the current can be coupled with relaying by means of power relays, whether these be of an electromagnetic or static type.

The module also includes, in its various connecting means, connectors which not only provide interconnection but which also carry control signals. There are thus signal links and interconnections with other units and function indicators.

In a modular design in accordance with the invention, it is necessary to provide an electrical supply to each module, and to provide it with its necessary electronic means, which is normally of a different type for each module. It is also necessary to provide outputs for connection between modules. On the other hand it is possible to adapt the circuit board to various equipment levels. In addition, high reliability is obtained with power which is integrated by distribution over several modules. Implementation is thus made easier. It is also possible to use the modules in other vehicles.

Reference is now made to FIG. 8, which shows another embodiment of a circuit board according to the invention. This circuit board comprises a support 90, in the form of a housing which may for example be of a plastics material. Modules 92 and 93 are fixed on an upper wall 91 of the housing.

The support 90 has a single power supply distribution layer 94, which provides the power supply and interconnections between the modules. This connection layer 94 enables signals and energy to be exchanged between the two modules 92 and 93. The modules in FIG. 8 have two layers. The main elements of the module 92 are a connector 95, a means 96 for providing protection against excessive voltages and currents, and an integrated electronic circuit module 97 for producing power. This power circuit is connected on a connecting layer 98, and, through its integrated output 99, to a further connecting layer 100 which carries the electronic part of the module 92. The connecting layer 98 also carries a conductive cross-connecting pin 101, which has a first end fixed to the connecting layer 98, for example by being soldered on to a conductive part of the latter. The pin 101 has an elongated body which passes through a sealed passage 102, and a second end which is held in a female clip fitted on a conductive portion of the connecting layer 94 on the other side of the upper wall 91 of the support housing 90. A plug-in connection for the modules is thus provided on the support housing 90.

The module 93 is substantially identical with the module 92, and in FIG. 8 the same components are indicated on the module 93 with the same reference numerals as for the module 92, but with the suffix "a".

The support 90, with its single connecting layer 94, enables the circuit board to be easily adapted to the various levels of equipment in a given vehicle. It also facilitates adaptation of the circuit board with other modules for use in other vehicles. It gives good reliability due to the integration of the power supply. The circuit board enables the power supplies to be grouped together, while the inter-module connections are integrated in it. A common electronic module can be incorporated on the connection layer 94 of the support housing.

Referring now to FIGS. 9 to 11, these show three embodiments of the integration scheme provided by the invention. In these three Figures, those elements which are identical or similar to each other carry the same reference numerals as each other.

In FIG. 9, the module comprises a housing 110, within which there is a single connection layer 111, on which the connecting means, consisting mainly of conductive strips, are disposed on a substrate of insulating material which is conductive to heat. On the upper face of the module, a connector 112 is arranged, having three conductive pins connected to the connection layer 111. The upper face also includes two inserted female contacts 116b and 117b, which receive the connecting fingers 116a and 116b of a fuse, for example the fuse 113. The connecting layer 111 also carries the power circuits 114 and 115, together with components such as the components 128 and 129 which constitute the integrated electronic part of the module.

In FIG. 10, the housing 120 of the module has two connecting layers, 123 and 124 respectively. In this arrangement, the layer 124 carries the power circuits, together with any heat radiating means associated with them, for disposal of heat by radiation at the free upper face of the housing 120. The layer 123 carries the logic circuits and the various low-power components. The situation is reversed if the power components have means for disposing of heat by convection, these being arranged to be thermally coupled with, for example, the chassis of the vehicle which serves as a heat sink.

FIG. 11 shows a module on part of a circuit board which includes a base 133 and a housing 131, in which a connecting layer 132 is mounted. The connection layer 132 enables external connections to be made between the modules disposed on the circuit board. In this case, each module, for example the module 130, includes a snap connector 134, for engagement on the upper surface of the circuit board 131 to 133. The snap connector 134a has a set of conductive pins, for example the pin 134a, the end 134b of which makes contact with a conductive zone of the connecting layer 132.

Referring now to FIG. 12, this shows one form which may be taken by the side walls of the modules, for the purpose of facilitating the insertion of several modules on a common circuit board. FIG. 12 shows part of two modules 140 and 141 in top plan view and in cross section. The modules have side walls 142 and 143, which are in contact with each other when the modules are suitably installed on the upper surface of the circuit board. The wall 142 of the module 140 is formed with guide and securing slots into which corresponding tongues 146 and 145, carried by the corresponding wall 143 of the module 141, are inserted. The other side wall 144 of the module 141, which is not in contact with any other module if the module 141 is at the end of the group, is formed with guide slots 147 and 148.

Turning now to FIG. 13, this shows one form of a module 150 having a single connecting layer 160. The module 150 has three connectors 152, 154 and 156 on its upper surface. The connector 152 connects to the electronic unit that provides the control function and interconnects between modules, and which brings the control signal transmissions together. The connector 154 is for connection to the electrical supply source, while the connector 156 is for power distribution towards the various electrical loads.

The connecting layer 160 is connected to the connectors 152, 154 and 156 through conductive pins, which are joined to sets of mating conductive elements. These latter are carried on respective connector pieces 151, 153 and 155. The pattern of each set of conductive elements in the connector pieces 151, 153 and 155 is matched to that of the conductive elements in the corresponding connectors 152, 154 and 156.

In one embodiment, the connecting layer 160 carries the electronic power components such as a circuit 158, and electronic processing circuit components such as the component indicated at 159. Fuses, such as that indicated at 157, are also arranged to plug in to the upper part of the module.

In a preferred arrangement, at least two of the three connector pieces 151, 153 and 155 are in the form of rigid bars, so that the associated connecting wires can be grouped together, and so that these bars can be fitted by simple insertion on the corresponding connectors 152, 154 or 156 so as to assemble the various modules together. This arrangement is particularly suitable if the modules have their side walls configured in the way described above with reference to FIG. 12.

FIG. 14 is a top plan view which shows three modules 160, 161 and 162 respectively, associated together through two electrical and mechanical coupling bars 163 and 164.

The coupling bar 164 provides the connection of the modules to the electrical power supply. It accordingly includes electric wires 166 to 170 which carry the earth connections and the various electrical voltages required, together with the battery connection, and so on. The coupling bar 164 overlies the three modules 160 to 162. These latter may or may not be mounted on a suitable flat support base, or plate (not shown), arranged under the modules. The sole purpose of such a support plate would be to provide a mechanical connection, and if necessary to act as a means for dissipating heat produced by the modules. If such a support is provided, it accordingly carries means for fastening mechanically to the modules, as well as heat transfer means for thermal coupling with those components integrated in each module which generate heat.

In another embodiment, the coupling bar 164 is made of a rigid material and is constructed in the form of a rigid beam, which may for example have a C-shaped cross section and which is coupled to U-shaped elements, so as to give a snap-fitting engagement, for example, on the upper surface of each module 160 to 162.

Each of these modules carries a connector 173a, 174a and 175a in a selected, accessible, part of the top surface of the module. The coupling bar 164 carries corresponding connectors 173b, 174b and 175b respectively, in corresponding positions. These connectors carried by the coupling bar are fitted in the respective connectors 173a to 175a. The top face of each module also carries fuses 176a, 176b, 176c and 176d, together with connectors 177a, 177b and 177c. The references for these various components are indicated in FIG. 14 only in respect of the module 162. The connectors 177a to 177c connect the corresponding module to each of the electrical loads, or to each group of electrical loads, which is to be controlled and supplied with power through that module.

Each module 160 to 162 also includes two connectors 178a and 179a, seen in the lower part of FIG. 14, which connect the module with the other coupling bar 163. The coupling bar 163 is of course provided with corresponding connectors 178b and 179b, and contains a set of wires for the electrical connection at low power levels for the logic part of the modules, so as to provide the interconnection 172 between the modules and such electrical function devices of the vehicle that are energised directly at low power levels.

Within each module 160 to 162, in at least one of the various embodiments described above, there is at least one connecting layer which includes an electronic "heart". In particular, this may comprise circuitry (indicated in broken lines at 180 in FIG. 14) providing a relay facility and power circuitry, and which includes electromagnetic and/or transistor relays. In the latter case these consist of power transistors, in particular of the MOS type, or again intelligent power components. Another logic part, indicated in broken lines at 181 in the module 162 in FIG. 14, contains the low-power electronic components which carry out the processing operations (mainly on the logic signals).

Figure 15:
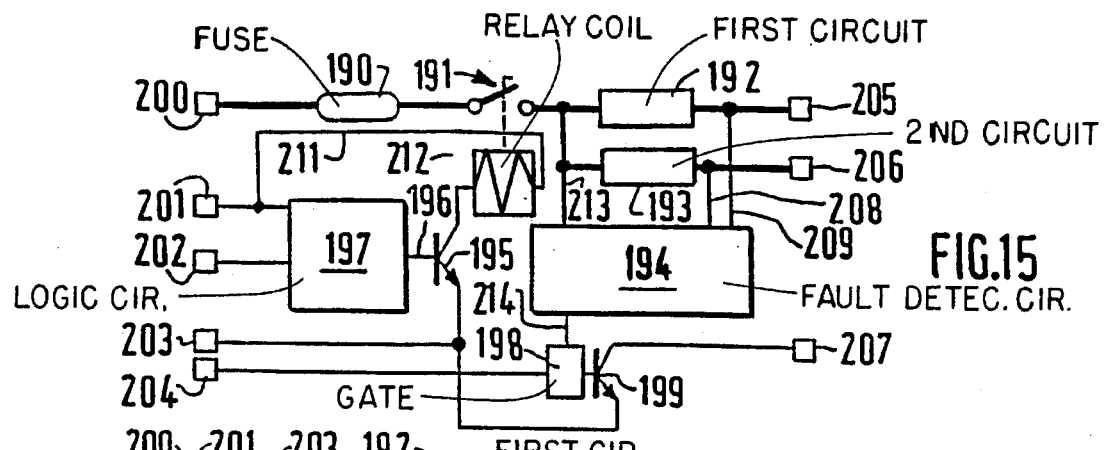
FIG. 15 is a block circuit diagram showing one example of an application of the concept of the invention.
Figure 16:
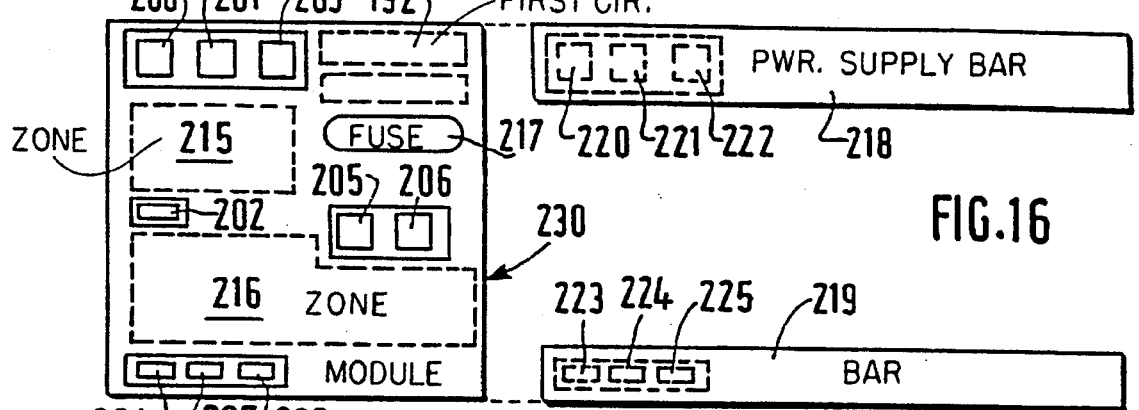
FIG. 16 is a diagrammatic plan view showing an arrangement of components of the circuit shown in FIG. 15.

Reference is now made to FIGS. 15 and 16, which show the first of two examples of how the concept of the present invention can be applied. FIG. 16 is a diagrammatic top plan view of a module incorporating the circuit shown in FIG. 15. Here, an input 200 is connected to the positive terminal (the "+ battery" terminal), and also to a first terminal of a protective device such as a fuse 190, the other terminal of which is connected to a first terminal of a power relay in the form of an electromagnetic relay, having a contractor 195 and a relay coil 212. The other terminal of the relay is connected to the respective inputs of the first and second circuits 192 and 193, for measuring current flowing in the line connecting the terminal 200 to the relay.

A second input 201 is connected to the power supply terminal referred to as the "+ after contact" or "+ACC" terminal on the output of an anti-theft device (which is not shown in FIG. 15). This polarity is communicated firstly to the polarising input of a logic circuit 197, which is arranged in the zone 216 in the module of FIG. 16, and secondly to a first terminal of the relay coil 212 via a wire 211. The other terminal of the relay coil 212 is connected to the collector of a control transistor 195, the emitter of which is connected to ground 203 and also to the first input of a logic gate 198. The base of the control transistor 195 is connected to the output of the logic circuit 197.

One input terminal 202 of the logic circuit 197 is connected to a control device not shown, which produces a waveform when an input condition is satisfied, and which causes the relay 191, 212 to change its state.

The other terminal of the logic gate 198 is connected to an input 204 of the overall circuit of FIG. 15. This receives a high logic level H when the above mentioned control device calls for a test by a warning indicator or telltale, which is connected on an output 207 of the FIG. 15 circuit. The indicator activation terminal 207 is polarised on the output of the collector of a second power transistor 199, the emitter of which is also connected to ground at 203. The base of the transistor 199 is connected to the output side of the logic gate 198.

When the logic gate 198 is an OR gate, the warning indicator connected to the output terminal 207 is lit if the indicator test is called for, or if an output 214 of a fault detection circuit 194, which is connected to a second input of the OR gate 198, is for example in the high active state.

The fault detection circuit 194 has three inputs 213, 208 and 209. The input 213 is connected to the common point between a first current measuring circuit 192 and a second current measuring circuit 193. The input 208 is connected to the other terminal of the circuit 193, while the input 208 is connected to the other terminal of the first current measuring circuit 192. When the two values of voltage measured at the terminals 213 and 208 on the one hand, and at the terminals 213 and 209 on the other hand, do not differ by a predetermined value, the fault detection circuit 194 produces an active high level output 214 which causes the warning indicator connected to the terminal 207 to be lit.

The circuit shown in FIG. 15 also has two further power outputs 205 and 206, for providing a power supply to a given electrical functional device in two current modes.

FIG. 16 shows an application of the circuit shown in FIG. 15 to a module which may for example be similar to those shown in FIG. 14. Here, the upper part of the module 230 includes a connector, the terminals of which are indicated by the reference numerals 200, 201 and 203 in conformity with FIG. 15, and correspond to the terminals 220, 221 and 222 respectively of a connector which is carried on the power supply bar 218. The latter is shown in FIG. 16 before it has been fitted on to the module 230.

The module 230 also includes further separate connectors for the above mentioned terminals 202, 205 and 206, while in its lower part the module has a connector with three contact elements 204, 207 and 203, which correspond to the contact elements 223, 224 and 225 of a connector on the bar 219 for interconnection between the modules. Again, the bar 219 is shown in FIG. 16 before it has been fitted on to the module 230.

The fuse 197 in FIG. 15 is indicated at 217 in FIG. 16, while the connecting layer (not indicated in the drawing by a reference numeral) includes a zone 215 and the above mentioned zone 216, for electronic signal processing of the power supply signals and control signals respectively.

Figure 17:
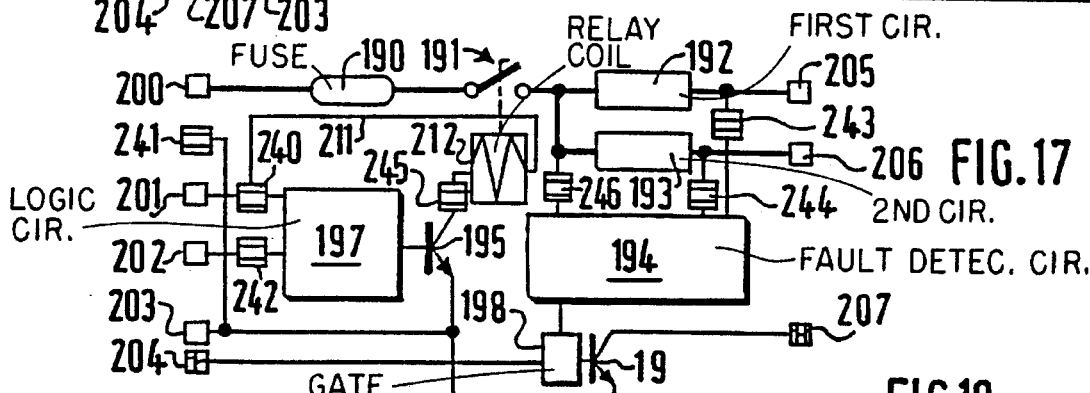
FIG. 17 is a block circuit diagram showing another example of the application of the concept of the invention.
Figure 18:
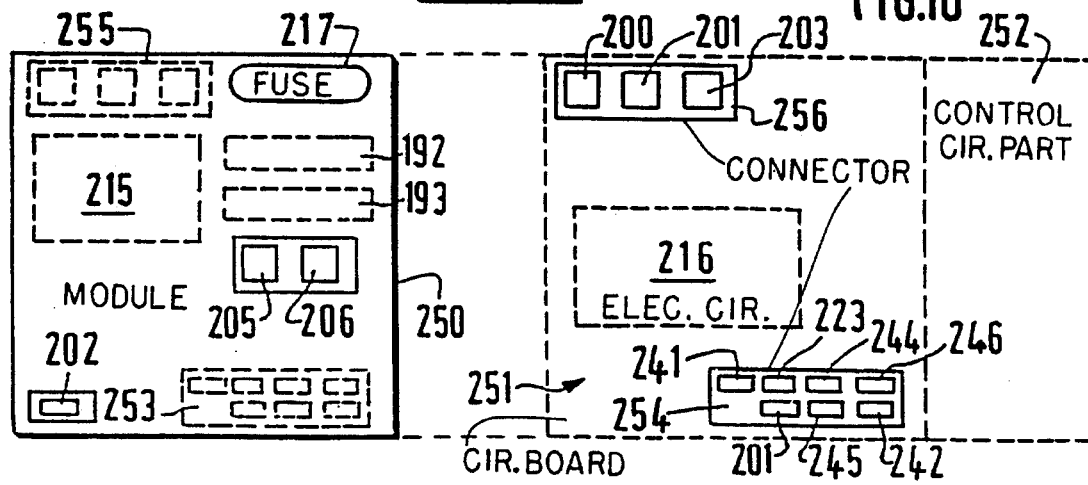
FIG. 18 is similar to FIG. 16, but relates to the circuit shown in FIG. 17.

Referring now to FIGS. 17 and 18, these show an alternative example of an application of the concept of the invention. In FIG. 17, those elements which carry the same reference numerals as those in FIGS. 15 and 16 are identical or similar, and need not be described again.

In the embodiment shown in FIGS. 17 and 18, components are integrated in two distinct blocks, namely a module 250 and a circuit board 251, 252. The module 250 includes the power supply part 215 of the electronic circuitry, and, in particular, the current measuring resistors 192 and 193. The circuit board 251, 252 has at least one connecting layer which carries electronic circuits 216, for carrying out the processing of control signals as in the arrangement shown in FIG. 17, together with a part 252 which includes the control circuits for carrying out the testing of the warning indicator, and which include the latter itself.

To this end, by contrast with the electrical circuit diagram of FIG. 15, in FIG. 17 some connection terminals have been added. These are as follows:

terminals 240 and 242 for connection to the "+ after contact" voltage source, and for receiving an input condition signal;

a ground terminal 241;

terminals 243 and 244 for input of current measurement signals;

a control terminal 245 for the control of the relay coil 212; and a reference voltage terminal 246.

When the removable module 250 is to be fitted on the upper surface of the contact board, connectors 253 and 255 on the underside of the module are engaged in corresponding connectors 254 and 256 on the upper surface of the circuit board. It is then merely necessary to connect the connectors 202 to the connectors 205, 206 in order to complete the assembly of the circuit board.

The present invention is of course not limited to the various embodiments described above, but embraces all the possible adaptations that are within the competence of a skilled person working in this technical field, and within the scope of the claims of this application.

What is claimed is:

1. A circuit board for the control and power supply of electrical function devices of a vehicle having an electrical supply source and a source of control signals, with the circuit board being connected between the supply source and the control signals source and the function devices, wherein the circuit board comprises: at least two plug-in modules, each of said modules grouping at least one of the functions selected from the electric function devices of the vehicle including the control signals source and the power supply, a support having a face with at least one connector on said face for receiving said plug-in modules; at least one connecting layer having electrical connecting means for establishing electrical connections within said support; a vehicle cabin computer having protective means for electrically protecting said computer, a power circuits module for management of the power supply of the circuit board and logic control circuits for the function devices, with electronic components of said power and logic control circuit disposed on at least one said connecting layer and interconnected thereby, to constitute an electronic part of the circuit board integrating together the protective means, power circuits modules and control circuits, said electronic part having means for accommodating at least one of said plug-in modules engaged in said at least one connector; and an electric means contained in said electronic part and associated with at least one of said functions for at least one of the function devices of the vehicle, wherein the circuit board further includes distribution means for at least one function selected from the electrical power supply to, and interconnection between, at least two of said plug-in modules.

2. A circuit board according to claim 1, wherein said distribution means is disposed inside the said support and comprises a plurality of conductive cross-connecting elements connected to at least one said connecting layer within the circuit board.

3. A circuit board according to claim 1, wherein at least one said element selected from each module and the support includes a single connecting layer, carrying electronic components of said power and logic control circuits.

4. A circuit board according to claim 1, wherein at least one said element selected from each said module and the support includes a first connecting layer which carries electronic components of the logic circuits and their connections, and a second layer which carries components of the power circuits together with said protective means.

5. A circuit board according to claim 1, wherein at least one element selected from each of at least one of said modules and said support comprises: a first connecting layer; a second connecting layer, with components of the power circuits being carried by said second connecting layer; and a third connecting layer, with components of the logic circuits being carried by said third layer.

6. A circuit board according to claim 1, wherein the plug-in modules are removable and include lateral guide means for fitting said modules together side by side on the said face of the support.

7. A circuit board for the control and power supply of electrical function devices of a vehicle having an electrical supply source and a source of control signals, with the circuit board being connected between the supply source and the control signals source and the function devices, wherein the circuit board comprises: at least two plug-in modules, each of said modules grouping at least one of the functions selected from the electrical function devices of the vehicle including the control signals source and the power supply, a support having a face with at least one connector on said face for receiving said plug-in modules; at least one connecting layer having electrical connecting means for establishing electrical connections within said support; a vehicle cabin computer having protective means for electrically protecting said computer, power circuits and logic control circuits for the function devices, with electronic components of said power and logic control circuit disposed on at least one said connecting layer and interconnected thereby, to constitute an electronic part of the circuit board integrating together the protective means, power circuits and control circuits, said electronic part having means for accommodating at least one of said plug-in modules engaged in said at least one connector; and an electrical means contained in said electronic part and associated with at least one of said functions for at least one of the function devices of the vehicle, wherein the circuit board further includes distribution means for at least one function selected from the electrical power supply to, and interconnection between, at least two of said plug-in modules, wherein the distribution means have at least one coupling bar carrying at least two of said connectors, and a plurality of connecting wires within said at least one coupling bar and connected to said connectors for receiving a corresponding connector of one of said plug-in modules, said at least one coupling bar having a plate element of C-shaped cross section whereby to constitute at least a mechanical coupling means for coupling between the plug-in modules.

8. A circuit board, for the control and power supply of electrical function devices of a vehicle having an electrical supply source and a source of control signals, with the circuit board being connected between the supply source and the control signals source and the function devices, wherein the circuit board comprises: at least two plug-in modules, each of said modules grouping at least one of the functions selected from the electrical function devices of the vehicle including the control signals source and the power supply, a support having a face with at least one connector on said face for receiving said plug-in modules; at least one connecting layer having electrical connecting means for establishing electrical connections within said support; a vehicle cabin computer having protective means for electrically protecting said computer, power circuits and logic control circuits for the function devices, with electronic components of said power and logic control circuit disposed on at least one said connecting layer and interconnected thereby, to constitute an electronic part of the circuit board integrating together the protective means, power circuits and control circuits, said electronic part having means for accommodating at least one of said plug-in modules engaged in said at least one connector; and an electrical means contained in said electronic part and associated with at least one of said functions for at least one of the function devices of the vehicle, wherein the circuit board further includes distribution means for at least one function selected from the electrical power supply to, and interconnection between, at least two of said plug-in modules, wherein at least one said element selected for each said module and the support includes a first connecting layer which carriers electronic components of the logic circuits and their connections, and a second layer which carries components of the power circuits together with said protection means wherein the support has a base member including said second connecting layer, and cross-connecting elements electrically connecting the fastening means to said connectors for receiving plug-in modules, said plug-in modules being removably connected electrically with said second connecting layer.

* * * * *